(12) United States Patent
Upp

(10) Patent No.: US 6,463,111 B1
(45) Date of Patent: Oct. 8, 2002

(54) METHOD AND APPARATUS FOR DESYNCHRONIZING A DS-3 SIGNAL AND/OR AN E3 SIGNAL FROM THE DATA PORTION OF AN STS-STM PAYLOAD

(75) Inventor: Daniel C. Upp, Southbury, CT (US)

(73) Assignee: Transwitch Corporaton, Shelton, CT (US)

( * ) Notice: Subject to any disclaimer, the term of this patent is extended or adjusted under 35 U.S.C. 154(b) by 0 days.

(21) Appl. No.: 09/865,324

(22) Filed: May 25, 2001

(51) Int. Cl.[7] .................. H04L 25/00; H04L 25/40; H04L 7/00
(52) U.S. Cl. ............................. 375/372; 370/505
(58) Field of Search .......................... 375/354, 356, 375/363, 368, 371, 372; 370/503, 505, 506

(56) References Cited

U.S. PATENT DOCUMENTS

| | | | |
|---|---|---|---|
| 4,159,535 A | 6/1979 | Fuhrman | 364/900 |
| 4,347,620 A | 8/1982 | Black et al. | 375/112 |
| 4,434,498 A | 2/1984 | Mathieu | 375/114 |
| 4,674,088 A | 6/1987 | Grover | 370/100 |
| 4,928,275 A | 5/1990 | Moore et al. | 370/102 |
| 4,964,142 A | 10/1990 | Annamalai | 375/118 |
| 5,033,064 A | 7/1991 | Upp | 375/118 |
| 5,052,025 A | 9/1991 | Duff et al. | 375/118 |
| 5,157,655 A | 10/1992 | Hamlin, Jr. | 370/84 |
| 5,285,206 A * | 2/1994 | Peters et al. | |
| 5,289,507 A | 2/1994 | Upp | 375/118 |
| 5,297,180 A | 3/1994 | Upp et al. | 375/112 |
| 5,461,380 A * | 10/1995 | Peters et al. | |
| 5,548,534 A * | 8/1996 | Upp | 370/504 |
| 6,064,706 A * | 5/2000 | Driskill et al. | 375/272 |

* cited by examiner

Primary Examiner—Jean Corrielus
(74) Attorney, Agent, or Firm—David P. Gordon; David S. Jacobson; Thomas A. Gallagher

(57) ABSTRACT

The desynchronizer of the present invention includes two FIFOs. The first FIFO has two address counters (write and read), an intermediate count register, circuitry for calculating the difference between the write and intermediate counts and the intermediate and read counts, a logic block for performing pointer leak and other arithmetic functions, and a digitally controlled oscillator (DCO). The second FIFO has read and write counters, a phase-frequency detector, and an internal VCO controlled by length measurements of the second FIFO. The desynchronizer receives data bits, pointer movement indications, and stuff indications from a DS-3/E3 demapper and, using the first FIFO, the address counters, etc., removes the low frequency components, including SONET/SDH systemic gapping in order to provide the second FIFO with a DS-3/E3 signal having a high frequency phase modulation. The second FIFO removes the remaining high frequency gapping jitter.

32 Claims, 10 Drawing Sheets

B DENOTES AN 8-BIT BYTE

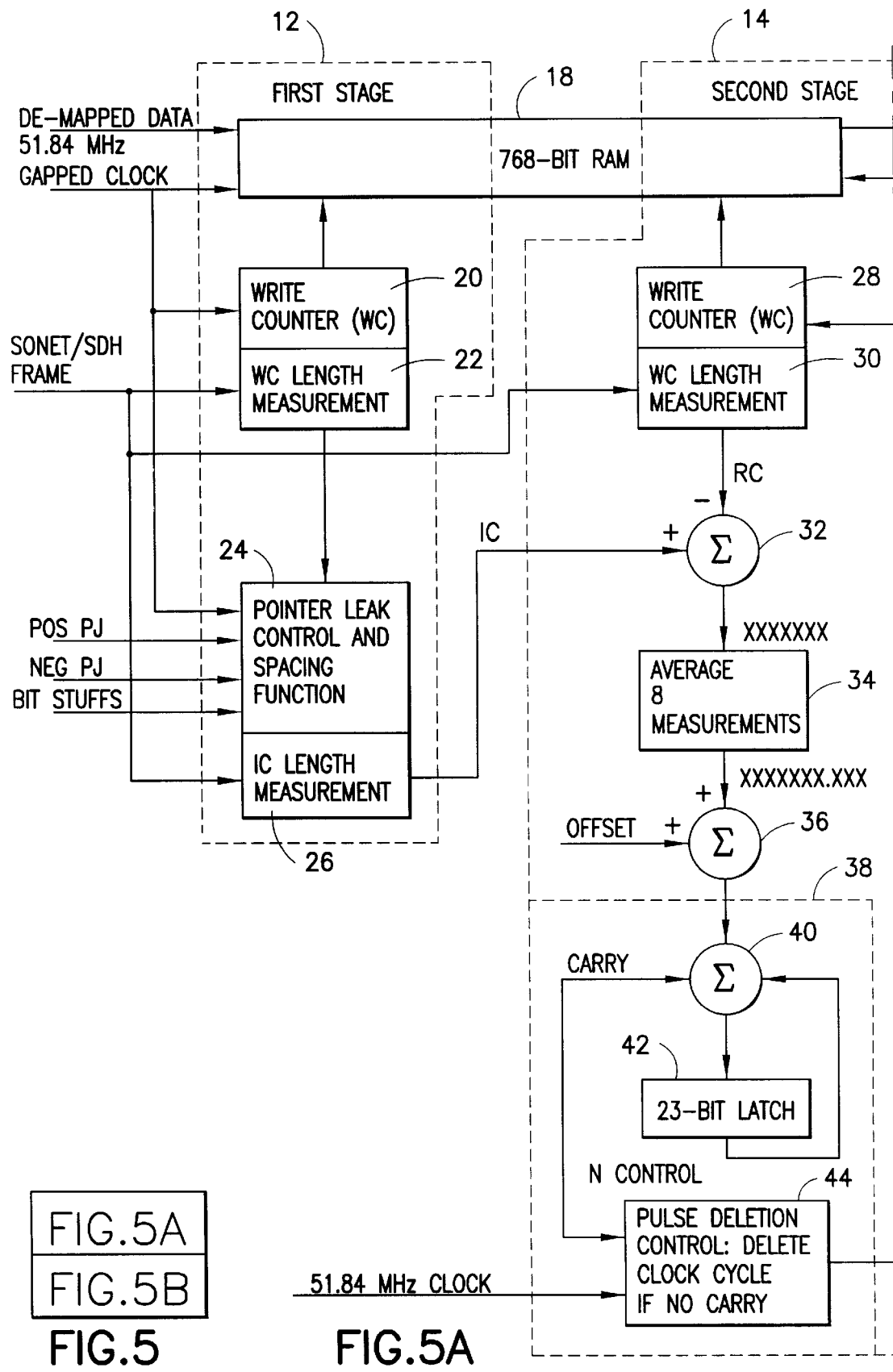

ically, the invention relates to methods and apparatus
METHOD AND APPARATUS FOR DESYNCHRONIZING A DS-3 SIGNAL AND/OR AN E3 SIGNAL FROM THE DATA PORTION OF AN STS-STM PAYLOAD This application is related to co-owned U.S. Pat. No. 5,033,064, 5,157,655, 5,289,507, 5,297,180, and 5,548,534 the complete disclosures of which are hereby incorporated by reference herein.

BACKGROUND OF THE INVENTION

1. Field of the Invention

The invention relates to telecommunications. More particularly, the invention relates to methods and apparatus for desynchronizing a DS-3 signal and/or an E3 signal from the data portion of an STS/STM payload.

2. State of the Art

Since the early nineteen sixties, three different digital multiplexing and signalling hierarchies have evolved throughout the world. The hierarchies were developed in Europe, Japan, and North America. Fortunately, all are based on the same pulse code modulation (PCM) signalling rate of 8,000 samples per second, yielding 125 microsecond sampling slots (1 second/8,000 samples=0.000125). Japan and North America base their multiplexing hierarchies on the DS-1 rate of 1.544 Mbit/sec±20 ppm, although the higher data rates in Japan do not correspond to the higher rates used in North America. Europe bases multiplexing on a rate of 2.048 Mbits/sec called E1 which carries thirty voice circuits compared to the twenty-four carried in the DS-1 rate. The next most common higher rates in the U.S. and Europe are DS-3 and E3, respectively, which have rates of 44.736 Mbit/sec±20 ppm and 34.368 Mbit/sec±20 ppm, respectively.

The Synchronous Optical Network (SONET) or the Synchronous Digital Hierarchy (SDH), as it is known in Europe, is a common transport scheme which is designed to accommodate both DS-1 and E-1 traffic as well as multiples (DS-3 and E3) thereof. Developed in the early 1980s, SONET has a base (STS-1) rate of 51.84 Mbit/sec in North America. In Europe, the base (STM-1) rate is 155.520 Mbit/sec, equivalent to the North American STS-3 rate (3*51.84=155.520). The abbreviation STS stands for Synchronous Transport Signal and the abbreviation STM stands for Synchronous Transport Module. STS-n signals are also referred to as Optical Carrier (OC-n) signals when transported optically rather than electrically.

Prior art FIGS. 1 and 2 illustrate the basic STS-1 signal which has a frame length of 125 microseconds (8,000 frames per second) and is organized as a frame of 810 octets (9 rows by 90 byte-wide columns). It will be appreciated that 8,000 frames*810 octets per frame*8 bits per octet=51.84 Mbit/sec. The first three columns of each row consist of transport overhead (TOH). Of these twenty-seven octets, nine are allocated for section overhead and eighteen are allocated for line overhead. The remainder of the frame (9 rows of 87 columns=783 octets) is referred to as the envelope or Synchronous Payload Envelope (SPE) or, in Europe, the Virtual Container. The first column of the envelope is reserved for STS path overhead (POH) and is referred to as the transport part of the envelope. The remaining 86 columns is referred to as the user part of the envelope. The difference between path overhead, line overhead, and section overhead is illustrated by FIG. 3. Path represents the complete transit through the SONET network. Line represents transit from one multiplexer to another. Section represents transit from one network element to another.

In order for data to be accommodated efficiently in the SPE, the 87 bytes of the SPE are divided into three blocks each including 29 columns. The POH occupies column 1 and "fixed stuff" (bytes which convey no information) is inserted into the 30th and 59th columns. Data is accommodated in the remaining 3*28=84 columns=756 bytes. An STS-n signal is n STS-1 signals which are frame aligned and byte-interleaved. Currently, the highest level STS signal is STS-192 which has a line rate of 9,953.28 Mbit/sec.

These various synchronous optical network signals contain payload pointers (prior art FIG. 2) which provide a method of allowing flexible and dynamic alignment of the SPE (Virtual Container) within the envelope or container capacity, independent of the actual contents of the envelope or container. Dynamic alignment means that the STS or STM respective SPE or Virtual Container is allowed to float within the STS/Virtual Container envelope capacity/container. For example, as shown in prior art FIG. 4, STS-1 SPE may begin anywhere in the STS-1 envelope capacity. Typically, it will begin in one STS-1 frame and end in the next frame as shown in prior art FIG. 4. The STS payload pointer is contained in the H1 and H2 bytes (the first two bytes) of the line overhead (prior art FIG. 2). These two bytes designate the location of the payload byte (the J1 byte) where the STS SPE begins.

When first generated, an SPE is aligned with the line overhead at the originating node (i.e., the pointer value is 0). As the frame is carried through a network, however, it arrives at intermediate nodes (e.g., multiplexers or cross-connects) having an arbitrary phase with respect to the outgoing transport framing of the intermediate nodes. If the SPE had to be frame-aligned with the outgoing signal, the frame would need to be buffered and delayed. Thus, the avoidance of frame alignment allows SPEs on incoming links to be immediately relayed to outgoing links without artificial delay. The location of the SPE in the outgoing payload envelope is specified by setting the H1, H2 pointer to the proper value (0–782). The pointer values are reset at each intermediate node in the network.

In addition, if there is a frequency offset between the frame rate of the transport overhead and that of the STS SPE, then the pointer value will be incremented or decremented, as needed, accompanied by a corresponding positive or negative stuff byte. If the frame rate of the STS SPE is too slow with respect to the transport overhead, then the alignment of the envelope must periodically slip back in time, and the pointer must be incremented by one. This operation is indicated by inverting selected odd bits (I-bits) of the pointer word to allow five-bit majority voting at the receiver. A positive stuff byte appears immediately after the H3 byte in the frame containing inverted I-bits. Subsequent pointers will contain the new offset value. Consecutive pointer operations must be separated by at least three frames in which the pointer value remains constant. This implies a very wide tolerance of clock accuracy required for maintaining SPE data, i.e., ±320 ppm. In comparison, a SONET node is specified to maintain a minimum timing accuracy of ±20 ppm if it loses its reference.

If the frame rate of the STS SPE is too fast with respect to that of the transport overhead, then the alignment of the envelope must be periodically advanced in time, and the pointer must be decremented by 1. This operation is indicated by inverting selected even bits (D-bits) of the pointer word to allow five-bit majority voting at the receiver. A negative stuff byte appears in the H3 byte in the frame containing the inverted D-bits. Subsequent pointers will contain the new offset value.

Both the SONET and SDH standards define a mechanism for mapping the DS-3 or E3 signal into the SONET/SDH payload. For DS-3, positive bit stuffing is defined in which each of the nine rows contain 622 bit positions, including one bit which may be data or stuff. A frequency of 44.736 MHz is achieved if one-third of the rows contain 621 information bits and one stuff bit, and two-thirds of the rows contain 622 information bits and no stuff bits. For E3, a positive-zero-negative mapping mechanism is used, with two stuff opportunities per every three rows. Two rows of 477 bits and one row of 478 bits transport a 34.386 MHz signal. Adding one extra data or one extra stuff allows transported frequency flexibility.

Thus, it will be appreciated that a SONET/SDH signal which carries a DS-3 or an E3 signal will contain overhead bytes, stuff bytes, and other control information. When the DS-3 or E3 signal is extracted from the SONET/SDH signal, these additional bytes must be stripped out, thereby producing gaps in the 51.84 MHz clock of the extracted signal. This "gapped" DS-3 or E3 must be reconstituted into a slower (44.736 MHz or 34.368 MHz, respectively) signal having no gaps. This process is generally referred to as "desynchronizing".

One state-of-the-art device which, among other things, desynchronizes DS-3 and/or E3 signals which have been extracted from a SONET/SDH signal is the Transwitch® L3M™ (level 3 mapper) device. The L3M™ device includes a desynchronizer having two parts: a pointer leak circuit and a phase-locked loop circuit. The pointer leak circuit absorbs the immediate effect of up to eight consecutive pointer movements (any combination of SPE or TUG-3 pointer movements) in either direction, and filters them out over time. A single pointer adjustment is an 8 Unit Interval (UI) phase step. The pointer leak circuit turns the phase step into eight 1-UI steps, widely spaced in time, allowing the phase-locked loop circuit to track. In normal operation, the output is one data bit and one clock cycle for each input bit. When a negative stuff occurs, eight extra bits are pulled from the signal and absorbed. Following this operation, the normal operation of one bit in for one bit out continues except that one extra bit is pulled from the FIFO every n frames. In this way, the pointer step is leaked out in 8 n frames, the value of n being programmable. The phase-locked loop circuit of the desynchronizer is externally connected to a line-frequency voltage controlled crystal oscillator (VCXO) via an external filter. This arrangement is designed to meet limits for jitter on the asynchronous line output signal, which is due to signal mapping and pointer movements.

The state-of-the-art desynchronizer has several disadvantages. For example, it requires an external VCXO and the pointer leak rate must be calculated by an external processor.

SUMMARY OF THE INVENTION

It is therefore an object of the invention to provide methods and apparatus for desynchronizing a DS-3/E3 signal from the data portion of a SONET/SDH signal.

It is also an object of the invention to provide desynchronizing methods and apparatus which do not require an external oscillator.

It is another object of the invention to provide desynchronizing methods and apparatus which do not require external logic to calculate a pointer leak rate.

It is a further object of the invention to provide a completely internal desynchronizer which meets all network requirements, e.g. regarding jitter and wander.

Another object of the invention is to provide a desynchronizer circuit which uses less chip and board space and is more cost effective.

In accord with these objects which will be discussed in detail below, the desynchronizer of the present invention includes three sections: a leak and spacing function section, a digitally-controlled oscillator (DCO) based closed loop section, and an analog output section. The first two sections include a first FIFO that is shared in a specific manner. The FIFO includes a RAM and two counters. A write counter provides the incoming bit write address, and is indexed on every bit entered into the FIFO. A read counter provides the address of the bit to be read out, and is indexed on the DCO clock. An intermediate count (or location) calculation is indexed synchronously with the received SONET/SDH frame phase (on a row basis or otherwise), and defines the boundary (location) between two parts of the FIFO; i.e., the leak spacing section of the FIFO and the DCO-based closed loop section of the FIFO. Length measurements of both FIFO parts and the calculation of the intermediate count are synchronously made with the received SONET/SDH frame phase (preferably on a row basis). The combination of the synchronicity of the two measurements and the calculation, together with the size of the increments, as described below, significantly reduce the phase noise impact of the SONET/SDH overhead.

The first two sections provide the third section with a DS-3/E3 signal having a high frequency phase modulation of known characteristics. Substantially all of the low frequency components, including SONET/SDH systemic gapping are removed by the first two sections. The third section is a smoothing stage which includes a PLL having a second FIFO with read and write counters, a phase-frequency detector, and an internal analog VCO controlled by length measurements of the second FIFO. The second stage substantially removes the remaining high frequency gapping jitter (approximately 3.42 MHz). According to the presently preferred embodiment, a fixed frequency of 51.84 MHz is derived from the 19.44 MHz STS-3 or STM-1 clock through 8 x multiplication and /3 division. The first FIFO is preferably a 768-bit RAM, and the two counters (write and read) are preferably each ten bits long. Data is entered into the first FIFO from a SONET/SDH de-mapper which strips away all of the SONET/SDH overhead as well as any bits in the payload which do not represent DS-3/E3 data. As such, data enters the FIFO on a gapped 51.84 MHz clock, with the gaps representing missing clock pulses during which no data enters the FIFO. This inlet clock which is gapped is used to index the write counter as well as a pointer leak control and spacing function. The read counter, on the other hand, is indexed on a DCO gapped clock (the gapping being high frequency in nature). The DCO gapped clock is derived from the 51.84 MHz input gapped clock via a closed loop spacing circuit which uses the intermediate count calculation and the read counter. The intermediate count preferably is calculated synchronously with the SONET/SDH row time. More particularly, the intermediate count is incremented in one manner for a DS-3 signal and in another manner for an E3 signal. In the case of a DS-3 signal, the exact frequency of 44.736 MHz is produced when three rows of a SONET frame contain one row of 621 data bits and two rows of 622 data bits. This bit rate is achieved by incrementing the intermediate count according to a schedule which also takes into account pointer leaks and stuffs. In the case of an E3 signal, the exact frequency of 34.368 MHz is produced when three rows of a SONET frame contain one row of 478 data bits and two rows of 477 data bits. This bit rate is achieved by incrementing the intermediate count according to a schedule which also takes into account pointer leaks and stuffs.

The DCO generates the DCO gapped clock from the 51.84 MHz clock and from a loop control signal. The DCO nominally produces ten or eleven output pulses per sixteen pulses of the 51.84 MHz clock in the case of an E3 signal and thirteen or fourteen output pulses per sixteen pulses of the 51.84 MHz clock in the case of a DS-3 signal to produce the outlet gapped clock which will track the source E3 or DS-3 frequency. The exact ratio of pulses is adjusted based on the difference (mod-256) between the intermediate count and the read counter count. More particularly, the difference between the read count and the intermediate count is read periodically and averaged every eight measurements. The average is expressed as a ten bit number which is added to a twenty-three bit offset to produce the loop control signal. The twenty-three bit loop control word is supplied to a twenty-three bit accumulator and twenty-three bit latch. The accumulator outputs a twenty-three bit sum and a carry. The latch stores the sum and the carry is stored in a flip-flop. Every time the DCO counter cycles through sixteen pulses of the 51.84 MHz clock, the accumulator performs a twenty-three bit add of the new control word with the contents of the latch. The frequency of the carries depends on the value of the control word. When the carry is active, the pulse detection control passes the lower number of pulses per sixteen DCO clock pulses, i.e. thirteen for DS-3, ten for E3. This converts the 51.84 MHz clock to the DCO gapped clock which is used to read data from the first stage FIFO.

The write counter count and the intermediate count are also used to enable pointer bit leaks. The leak spacing is based on the observed pointer movements over time as well as on the length of the first section of the FIFO which is given by the difference between the write counter and the intermediate count. If the length of the first part of the FIFO deviates beyond a nominal length value, pointer leaks are enabled more frequently (negative if the length is smaller than the offset, positive if the length is larger than the offset).

The third stage of the desynchronizer of the invention includes a second FIFO which receives data from the second section of the first FIFO according to the DCO gapped outlet clock, associated write and read counters, and an analog portion. The analog portion includes a phase-frequency detector (PFD), a low pass filter, and an analog VCO. The MSB of the read counter and write counter of the second FIFO (which is preferably a 64-bit RAM) are inputs to the PFD. The Up and Down outputs of the PFD are summed by the low pass filter and the sum is used to control the internal analog VCO which is used to clock data out of the second FIFO and hence out of the desynchronizer.

Additional objects and advantages of the invention will become apparent to those skilled in the art upon reference to the detailed description taken in conjunction with the provided figures.

DETAILED DESCRIPTION OF THE PREFERRED EMBODIMENTS

Figure 1:
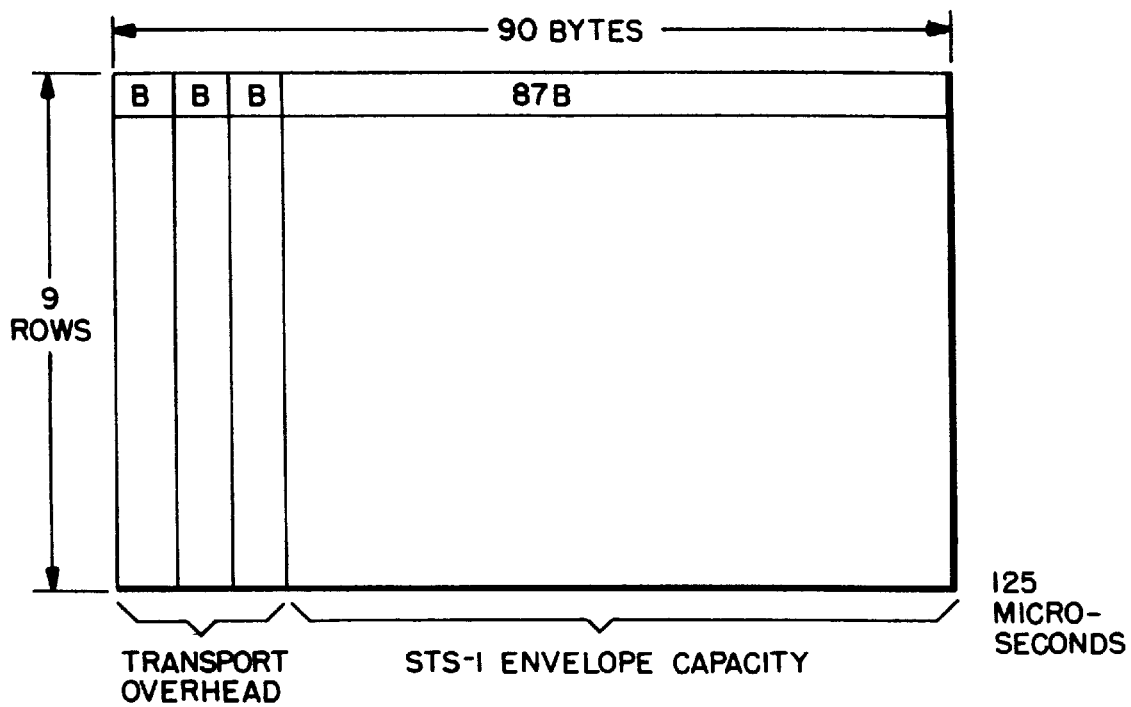
FIG. 1 is a schematic diagram of the layout of a SONET signal frame according to the Bellcore TA-TSY-00253 prior art document.
Figure 2:
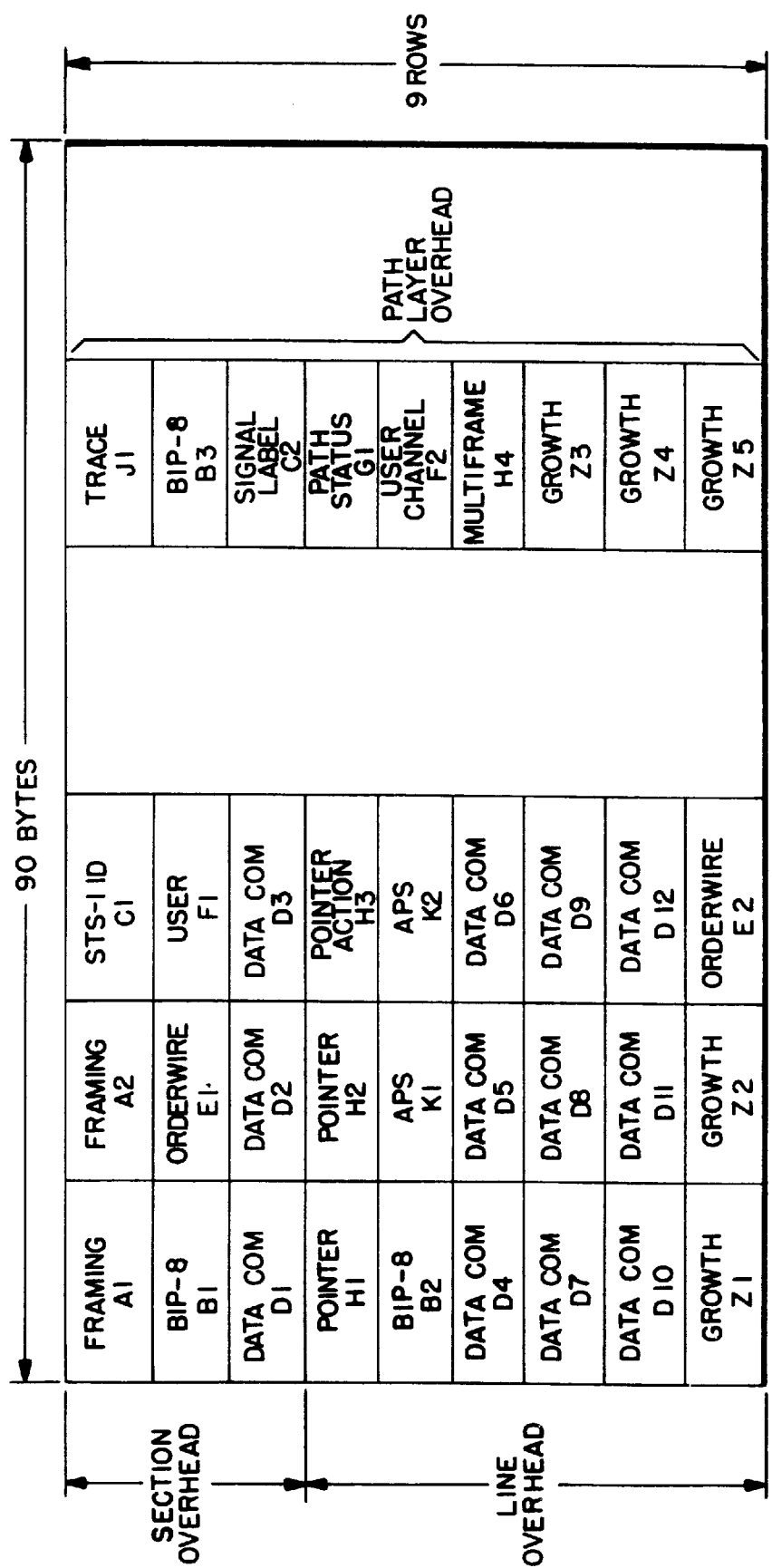
FIG. 2 is a diagram of the overhead byte location in a SONET signal frame according to the Bellcore TA-TSY-00253 prior art document.
Figure 3:
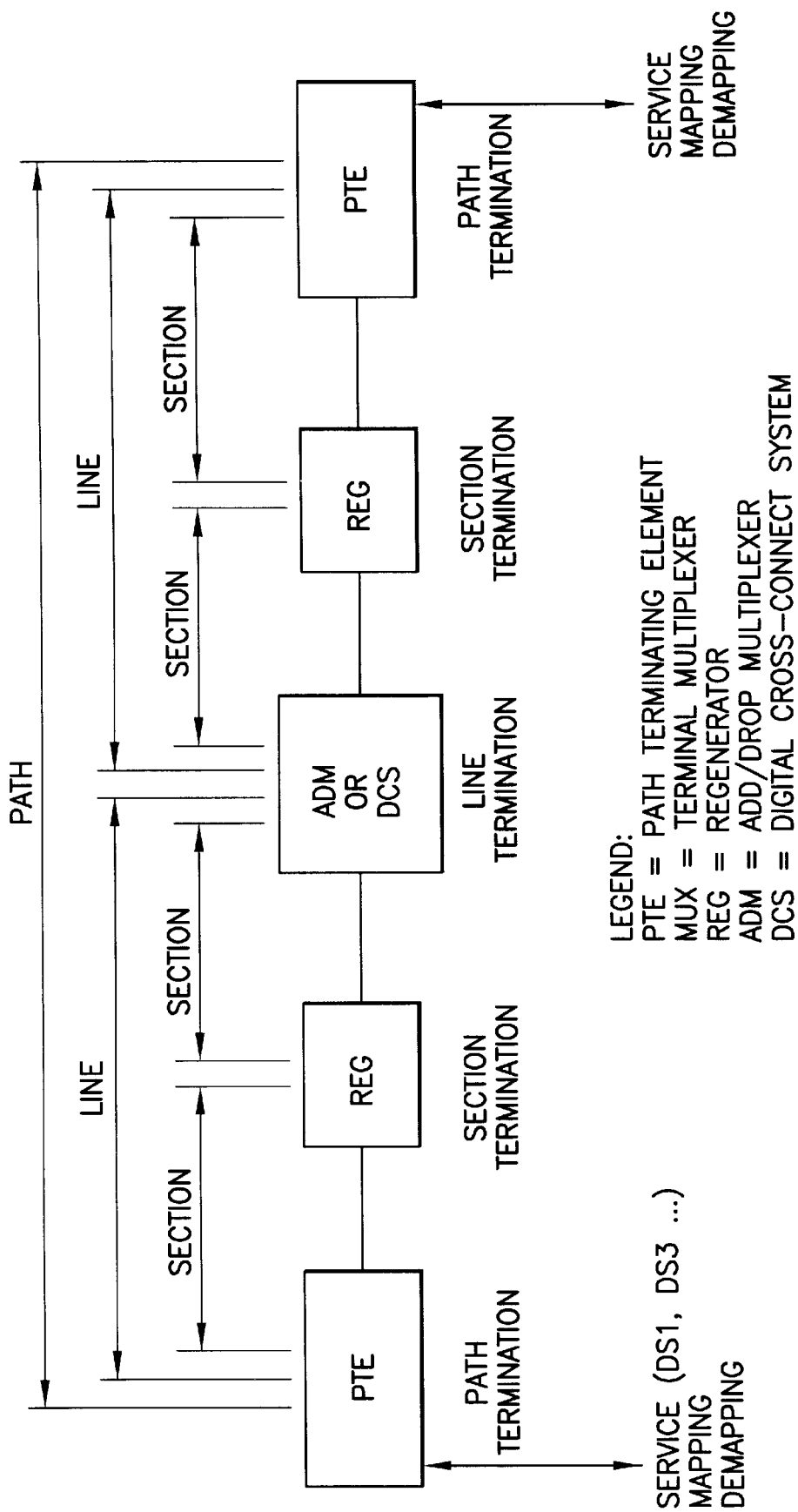
FIG. 3 is a prior art schematic diagram illustrating path, line, and section termination of a SONET signal.
Figure 4:
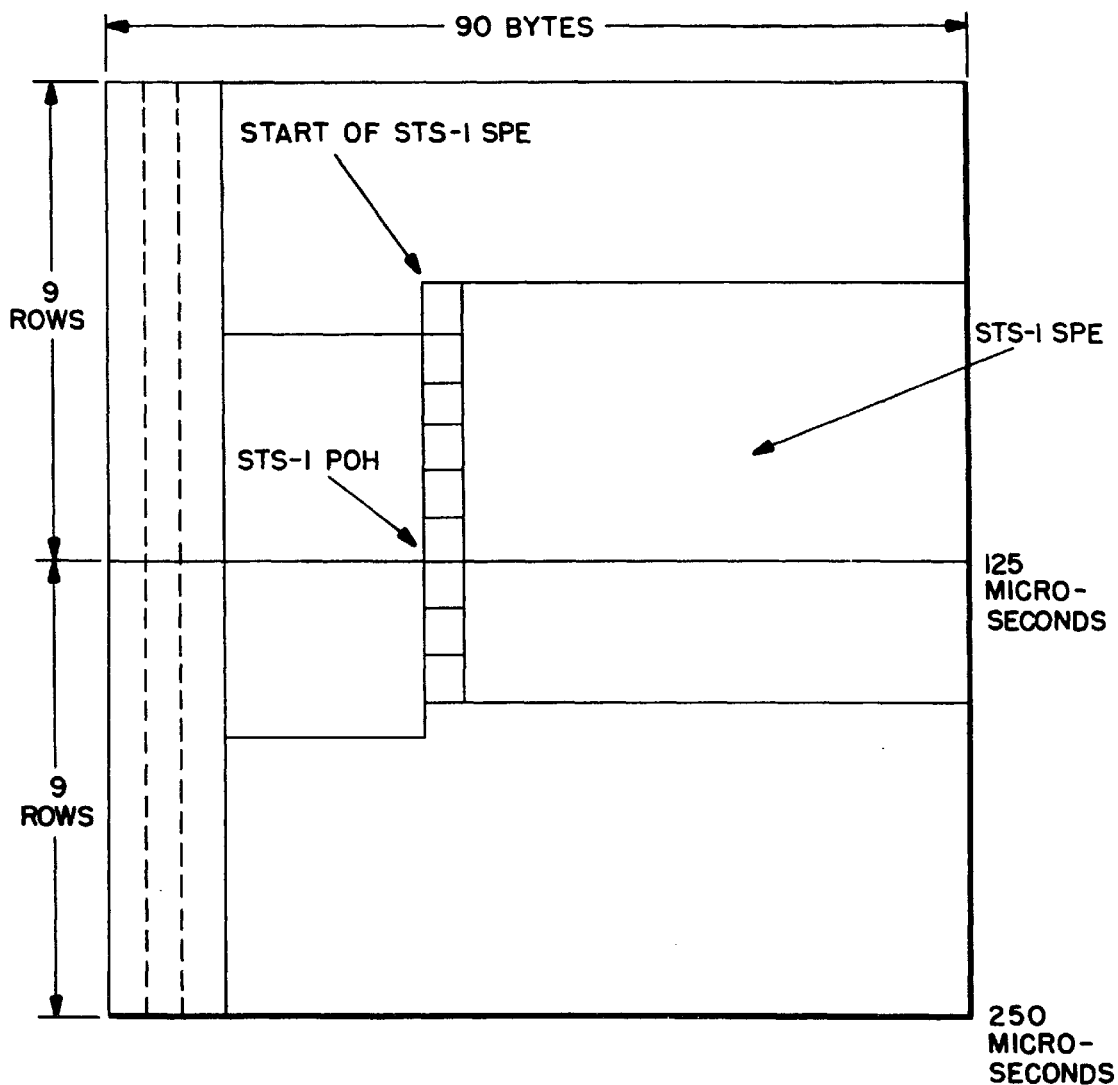
FIG. 4 is a prior art schematic diagram of a typical location of the SONET payload within two SONET signal frames.
Figure 5B:
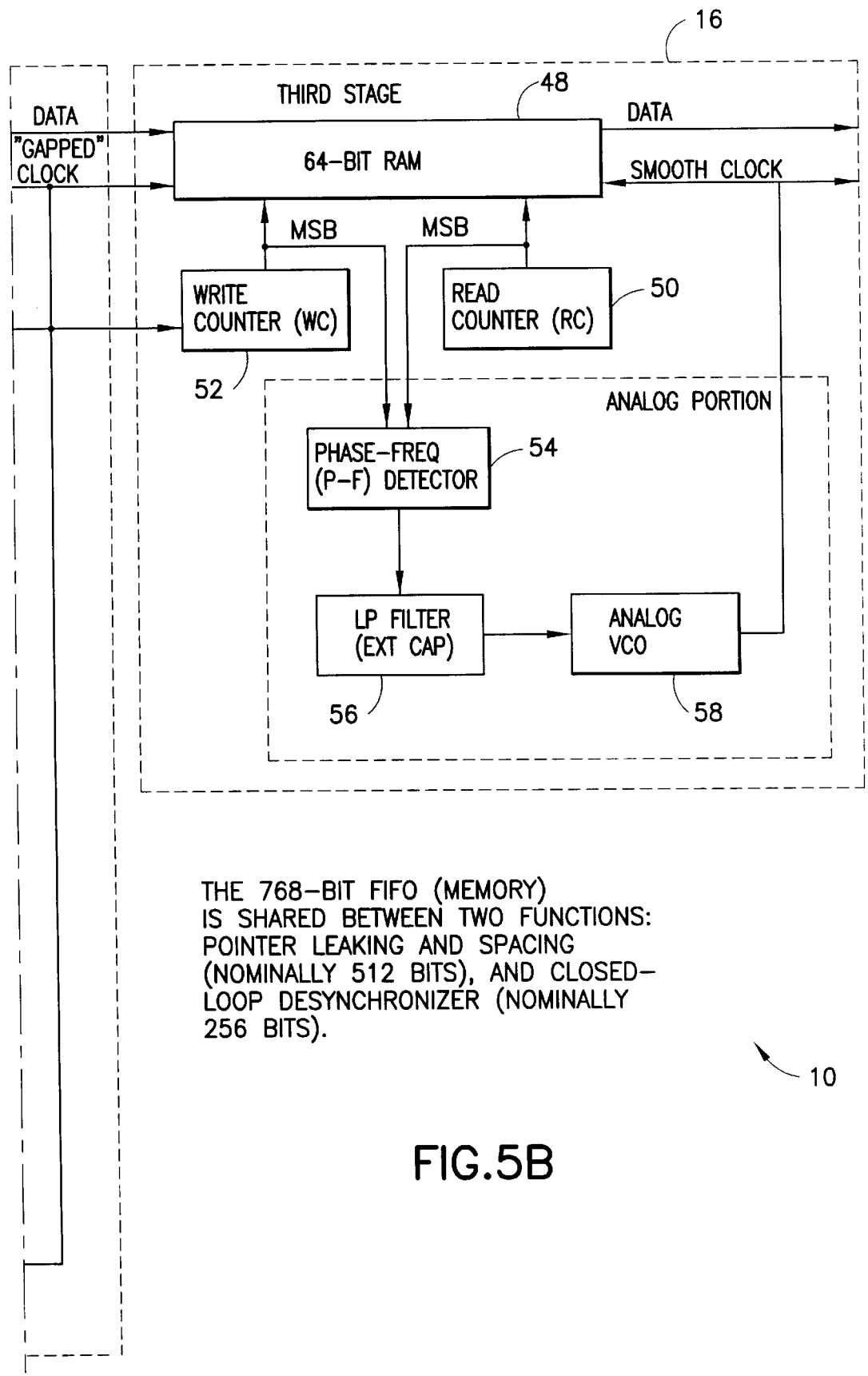
FIG. 5 is a simplified block diagram of an apparatus according to the invention.

Referring now to FIG. 5, the desynchronizer 10 of the present invention includes three sections: a leak and spacing function section 12 which performs prefiltering to substantially remove SONET gapping and pointer movements, a digitally controlled oscillator (DCO) based closed loop filter section 14 to substantially remove low frequency jitter, and a final filter section 16 which uses analog circuitry to substantially remove high frequency artifacts.

The leak and spacing function section 12 includes a FIFO formed from a portion of a preferably 768-bit dual-port RAM 18 (which is shared with the second section 14 as described below), a write counter 20, a write counter length measurement register 22, a pointer leak control and spacing function 24, and an intermediate count length register or calculation means 26 which is preferably implemented with a calculation circuit or logic or software. The portion of RAM 18 which forms the first stage FIFO is defined as that part with addresses between the write count and the intermediate count (modulo 768). The first stage FIFO has a maximum length of 512 bits, and a defined center point of 256 bits.

The first section 12 receives data bits, pointer movement indications, stuff indications and the SONET/SDH frame phase from a DS-3/E3 demapper (not shown). These signals include explicit indications of positive and negative pointer movements and DS-3/E3 bit stuffing events, as well as receive signal frame timing. As will be discussed in detail hereinafter, these explicit indications are used by the pointer leak control and spacing function 24 to index the intermediate count length measurement 26.

The first section 12 also receives the gapped 51.84 MHz clock. More particularly, the first section FIFO 18 receives only the de-mapped data which is clocked into the FIFO by the 51.84 MHz gapped clock. The preferably ten-bit write counter 20 is indexed (i.e., increased) on every bit entered into the FIFO 18.

As will be discussed in more detail hereinafter, the DCO-based closed loop filter section 14 includes a portion of the same 768-bit dual-port RAM 18, a ten-bit read counter 28, a read counter length measurement register 30, a difference summer 32 for finding the difference between the intermediate count measurement and the read counter measurement, an averaging circuit 34, an offset summer 36, and a DCO 38. The DCO 38 includes a twenty-bit accumulator 40, a twenty-three-bit latch 42, and a pulse deletion controller 44. The portion of the 768-bit dual-port RAM 18 which forms the FIFO for the second section 14 of the desynchronizer is that portion with an address between the intermediate count and the read count (modulo 768). The purpose of the DCO-based closed loop filter section 14 is to remove the low-frequency phase variations in the recovered signal which emanate from the first section.

As aforementioned, the boundary in the 768-bit RAM 18 between the first and second stages of the desynchronizer is defined by the value of an intermediate count IC. According to the invention, the IC is incremented in such a way as to track incoming data, but also remove most of the effect of the SONET systemic gapping, thereby easing the task of the second, closed-loop, part of the desynchronizer. IC value increments are made synchronously with the received SONET/SDH frame phase (on a row basis or otherwise, as discussed below), based on an algorithm whose elements include knowledge of whether DS-3 or E3 signals are being recovered, incoming pointer movements, received stuff bits, and the length of the first stage FIFO (i.e., the write count minus the intermediate count modulo 768). Data is "transferred" from the first stage of the desynchronizer (pointer-leak section) to the second stage (closed loop DCO section) when the IC is indexed. Stated another way, when the IC is indexed, control of the indexed data is moved from the first stage to the second stage.

In each row of a SONET STS-1 signal, there are 720 bits (90 bytes) per 125 microseconds. Within each row, there is a specified mechanism for mapping a DS-3 or E3 signal. Within each row, there are also three consecutive bytes of STS-1 overhead and one byte of SPE/VC-4 overhead. No data occurs during these byte times, thereby producing the gapping jitter. In order to remove the gapping effect, and closely match the transported carrier frequency, the invention provides an internal mechanism for indexing the IC based on received stuff and pointer movement information as well as on SONET/SDH structure. By making the indexes of the IC synchronous with the SONET frame frequency but at a higher rate with smaller increments (e.g., on a row or partial row basis), the large lower frequency effect of SONET gapping is significantly reduced. According to one embodiment, the invention utilizes an internal time increment, T80, of eighty bits (ten bytes), repeating exactly nine times per row, to perform a data spacing function. The T80 timebase is derived from the local clock timebase by the pointer leak and spacing function 24. From the 19.44 MHz local clock, every third bus clock defines T80. Using the T80 time base, the spacing function logic indexes the intermediate count 22 by specified amounts. The amounts are fifty-two, fifty-three, fifty-four, fifty-five or fifty-six for an E3 signal and sixty-eight, sixty-nine, seventy, or seventy-one for a DS-3 signal. Depending on pointer movement (i.e., positive or negative pointer justification) and the presence of stuff bits, the IC is incremented by a selected one of these amounts every T80. This incrementing produces an apparent step in the FIFO instantaneous length, but has no effect on the length measurement, as will be seen below.

According to another embodiment, the intermediate count is indexed once per received SONET/SDH row time (nominally 125/9 microseconds). In this embodiment, the IC is incremented once every row time by 475, 476, 477, 478 or 479 for an E3 signal, and by 621, 622, 623, or 624 for a DS-3 signal.

The DS-3 frequency (44.736 MHz) is exactly produced if 621 bits per row are transferred twice and 622 bits are transferred once, every three rows. The DS-3 stuffing algorithm is a positive stuffing algorithm. That is, the signal is oversampled and there is one stuff bit position that is used to match the frequency. The nominal DS-3 spacing pattern is 621 bits per 720 (which also equates to sixty-nine bits per eighty bits of the time increment counter T80, when utilized).

Figure 6:
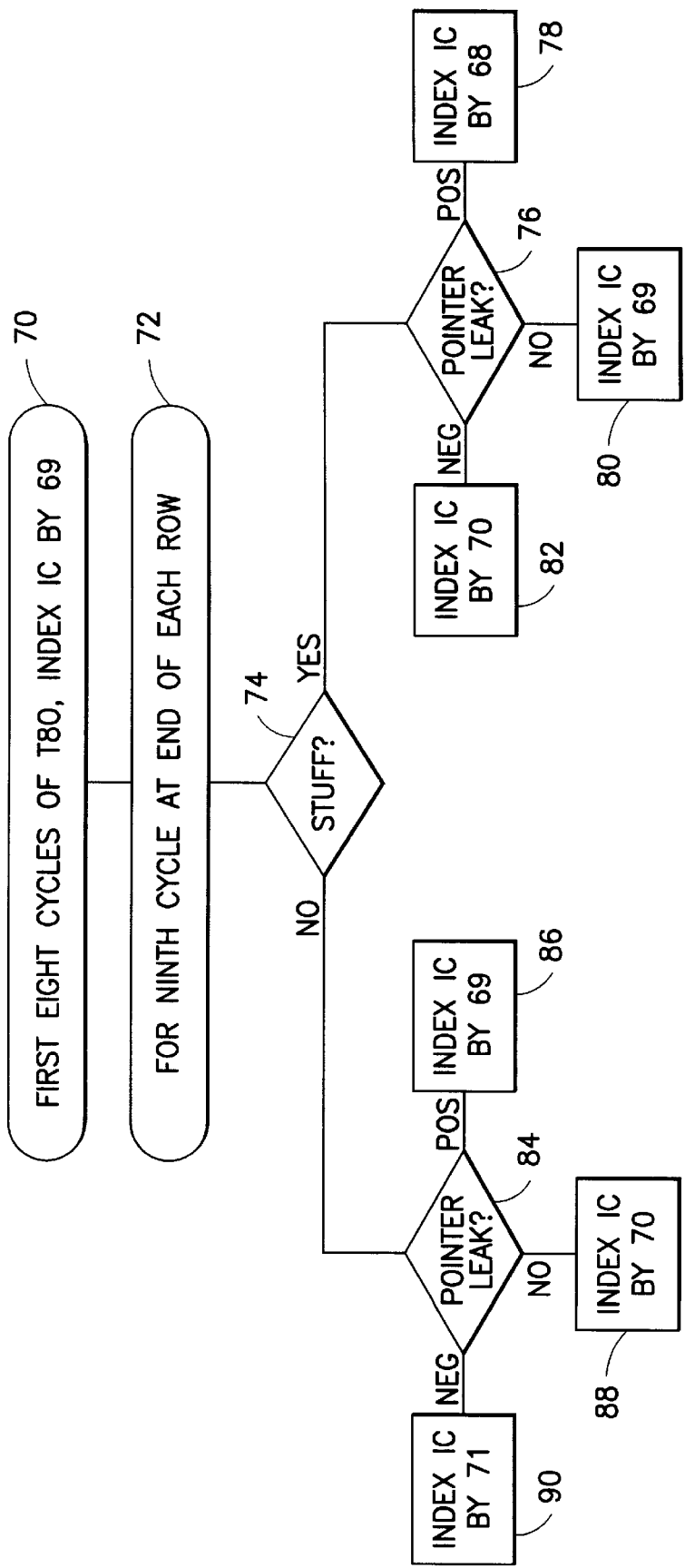
FIG. 6 is a simplified schematic flow chart of the control pattern for spacing a DS-3 signal according to the invention.

Turning now to FIG. 6, and with respect to the first embodiment, the logic for incrementing the IC in order to closely match the DS-3 frequency increases the IC by sixty-nine for the first eight cycles of T80 as indicated at 70 in FIG. 6. For the ninth T80 cycle, and for every ninth cycle thereafter as indicated at 72, incrementing of the IC depends on the stuff bit indications and pointer movement indications; the former being tracked according to bit stuff signals received by the circuitry 24 of FIG. 5, and the latter being generated by logic described in more detail hereinafter with reference to FIG. 8. If a stuff bit indication is detected at 74 and a positive pointer leak is indicated at 76, the IC is incremented by sixty-eight at 78. If a stuff bit indication is detected at 74 and no pointer leak is indicated at 76, the IC is incremented by sixty-nine at 80. If a stuff bit indication is detected at 74 and a negative pointer leak is indicated at 76, the IC is incremented by seventy at 82. If no stuff bit indication is detected at 74 and a positive pointer leak is indicated at 84, the IC is incremented by sixty-nine at 86. If no stuff bit indication is detected at 74 and no pointer leak is indicated at 84, the IC is incremented by seventy at 88. If no stuff bit indication is detected at 74 and a negative pointer leak is indicated at 84, the IC is incremented by seventy-one at 90.

According to the second embodiment of the invention where IC is incremented once per row, the IC is incremented by 620 if a stuff indication was active on the last incoming row and a positive bit leak was indicated. The IC is incremented by 621 if a stuff indication was active and no bit leak was indicated, or if the stuff indication was inactive and a positive bit leak was indicated. The IC is incremented by 622 if the stuff indication was inactive and no bit leak was indicated, or if a stuff indication was active but a negative bit leak was indicated. Finally, the IC is incremented by 623 if a stuff indication was inactive and a negative bit leak was indicated.

The E3 frequency (34.368 MHz) is exactly produced if 477 bits per row are transferred twice and 478 bits once, every three rows. By varying the amount of 477 and 478, the exact E3 frequency is matched. The E3 stuffing algorithm uses a positive/zero/negative stuffing scheme. That is, the signal nominally contains exactly enough bits in a pattern to match the nominal frequency. The E3 mapping has 480 information bits in two rows, and 472±1 information bits in the third row of a pattern. There are two stuff opportunities, S1 and S2. Nominally, one will contain data and one will be stuff, to transport 1432 bits per three rows, exactly 34.368 MHz. From this, stuff bits are added or deleted to match the exact frequency. Thus, the row may contain zero stuff bits (S1=data, S2=data), one stuff bit (S1=stuff, S2=data, or S1=data, S2=stuff), or two stuff bits (S1=stuff, S2=stuff).

Figure 7:
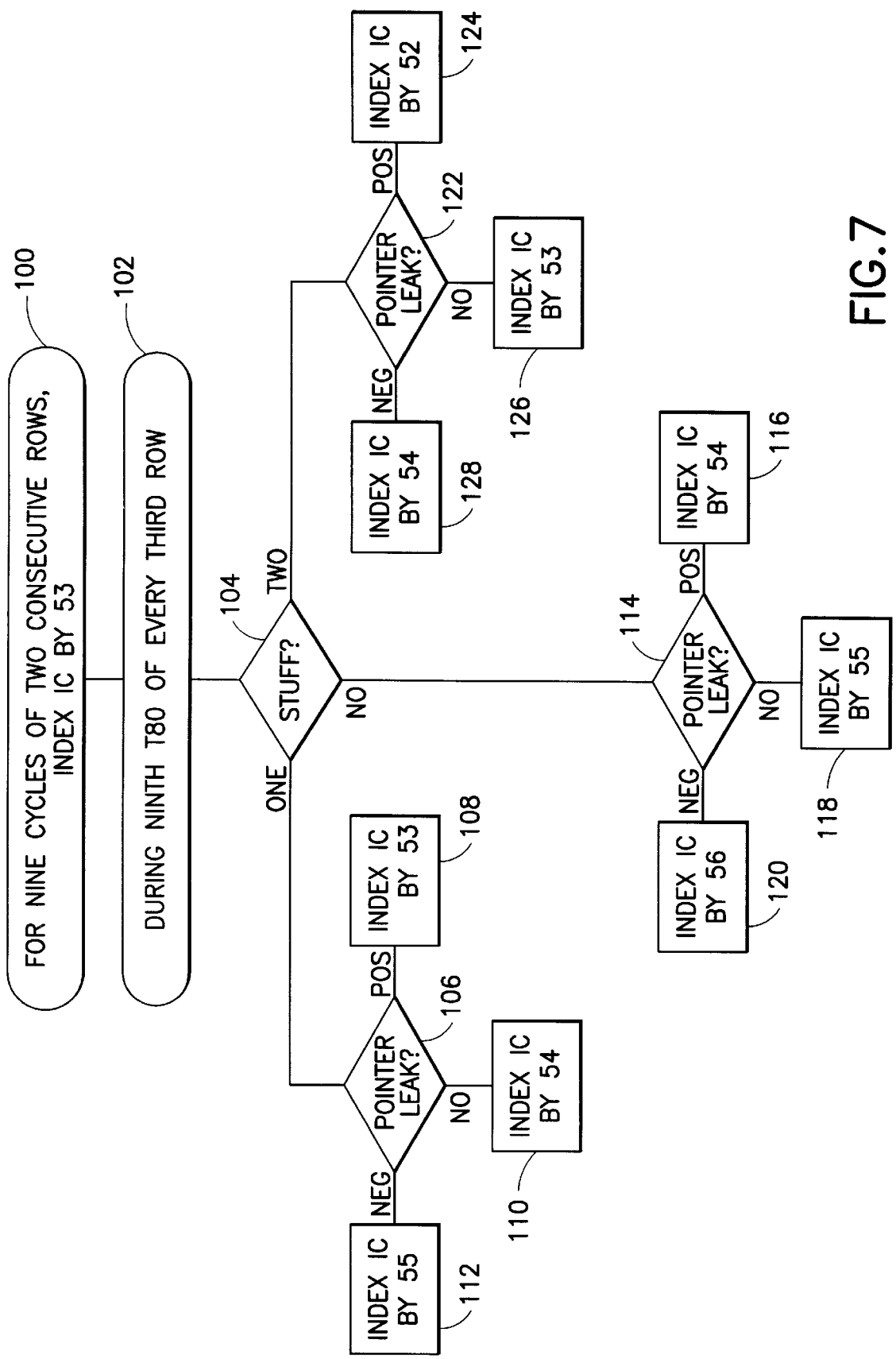
FIG. 7 is a simplified schematic flow chart of the control pattern for spacing an E3 signal according to the invention.

The nominal E3 spacing pattern is fifty-three bits per eighty bits of the time increment counter T80. Turning now to FIG. 7, and according to the first embodiment, the logic for incrementing the IC for closely matching the E3 frequency indexes the IC by fifty-three for the first nine cycles of two consecutive rows as indicated at 100 in FIG. 7. Beginning with the ninth T80 of every third row, as indicated at 102, indexing of the intermediate counter 22 depends on the stuff bit indications and pointer movement indications.

If it is determined at 104 that there is one stuff and it is determined at 106 that there is a positive pointer leak, the IC is incremented by fifty-three at 108. If it is determined at 104 that there is one stuff and it is determined at 106 that there is no pointer leak, the IC is incremented by fifty-four at 110. If it is determined at 104 that there is one stuff and it is determined at 106 that there is a negative pointer leak, the IC is incremented by fifty-five at 112.

If it is determined at 104 that there is no stuff and it is determined at 114 that there is a positive pointer leak, the IC is incremented by fifty-four at 116. If it is determined at 104 that there is no stuff and it is determined at 114 that there is no pointer leak, the IC is incremented by fifty-five at 118. If it is determined at 104 that there is no stuff and it is determined at 114 that there is a negative pointer leak, the IC is incremented by fifty-six at 120.

If it is determined at 104 that there are two stuffs and it is determined at 122 that there is a positive pointer leak, the IC is incremented by fifty-two at 124. If it is determined at 104 that there are two stuffs and it is determined at 122 that there is no pointer leak, the IC is incremented by fifty-three at 126. If it is determined at 104 that there are two stuffs and it is determined at 122 that there is a negative pointer leak, the IC is incremented by fifty-four at 128.

Where the second embodiment of indexing the IC once every row time is utilized, the IC will be incremented by 477 for the first two of every three sets of rows. For the third row, IC will incremented by: 475 if the received stuff indication bits S1 and S2 are 0,0 and a positive bit leak is indicated; 476 if S1, S2=0,1 or 1,0 and a positive bit leak is indicated, or S1, S2=0,0 and no bit leak is indicated; 477 if S1, S2=0,1 or 1,0 and no bit leak is indicated, or if S1, S2=0,0 and a negative bit leak is indicated, or if S1, S2=1,1 and a positive bit leak is indicated; 478 if S1, S2=1,0 or 0,1 and a negative bit leak is indicated, or if S1, S2=1,1 and no bit leak is indicated; and 479 if S1, S2=1,1 and a negative bit leak is indicated.

The spacing function described above significantly reduces the effect of the intrinsic SONET/SDH gapping jitter by translating it to smaller size, high-frequency increments which are more easily removed by the second, closed-loop desynchronizer portion as described in detail below. In particular, the FIFO length ambiguity produced by the arbitrary and varying position of the POH column in the STS-1 frame is removed.

Figures 8, 8A, 8B:
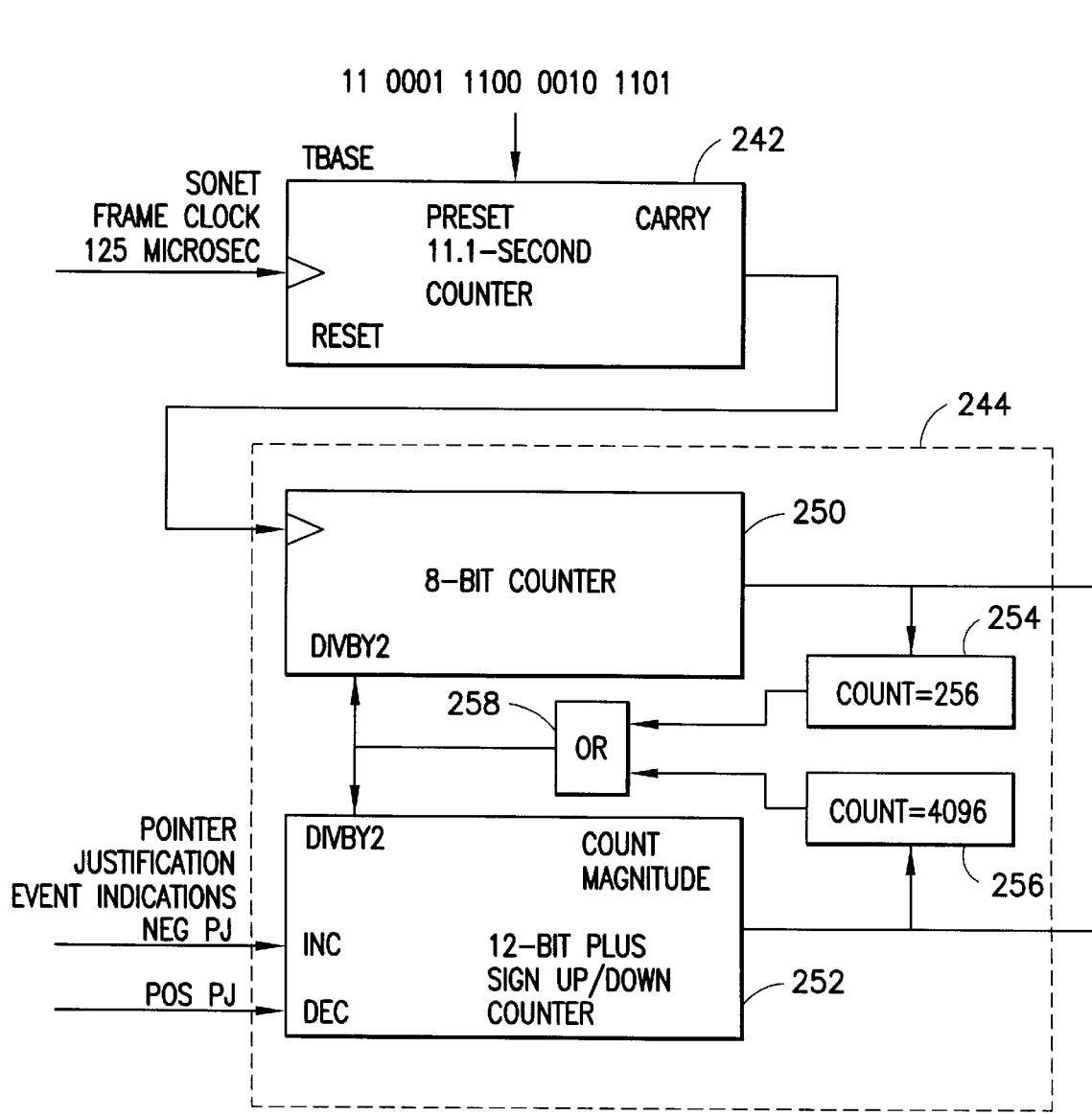
FIG. 8 is a simplified block diagram of the pointer leak control function of the invention.
Figure 8B:
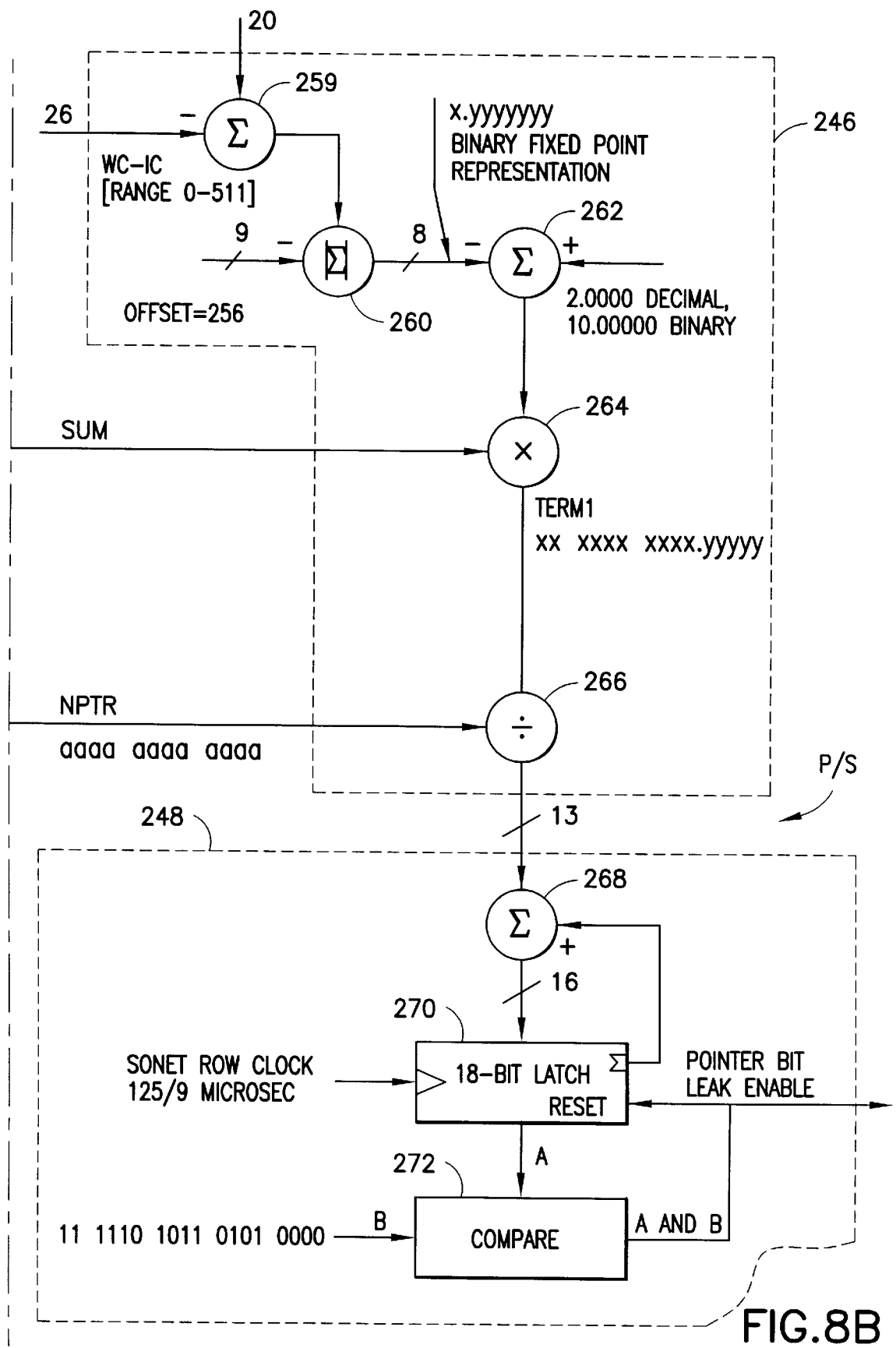

Turning now to FIG. 8, more details of the pointer leak control function are illustrated by a simplified block diagram. As shown in FIG. 8, the pointer leak control and spacing function 24 generally includes four sections: a time base section 242, a SUM and NPTR generating section 244, a FIFO length calculating section 246, and a pointer bit leak enabling section 248. The time base 242 receives input from the SONET frame clock and a preset value (110001110000101101) and outputs a carry signal, typically every 11.1 seconds to the SUM and NPTR generating section 244.

The calculation of when to leak out accumulated pointer movement bits is a function of observed received pointer movement occurrences and of the length of the first section of the FIFO. For the first part of the calculation, a measurement of the number of pointer movements over time is made. Two counters are used: counter 250 for recording time by counting the number of 11.1 second pulses from counter TBASE 242 (SUM in FIG. 8), and counter 252 for counting the number of positive pointers minus the number of negative pointers (NPTR in FIG. 8). By dividing the time by a number, a rough measure of pointer leak spacing is obtained. The counters (250, 252 in FIG. 8) will clearly overflow if allowed to run unchecked. At the same time, the counters should not be reset while the loop is in operation. The compromise is to halve (divide-by-2) the values in both counters if either gets to its maximum count. This mechanism of accumulating counts and periodic halving forms roughly a "leaky integrator" estimation of the desired pointer bit leak spacing.

In particular, the SUM and NPTR generating section 244 includes an eight-bit time counter 250, a twelve-bit pointer movement up/down counter 252, a first comparator 254, a second comparator 256, and an OR gate 258. The eight-bit counter 250 receives the above-mentioned carry output as its input and provides a SUM output to the FIFO length calculating section 246. The twelve-bit up/down counter 252 receives positive and negative pointer justifications as its increment and decrement inputs and provides a count magnitude (NPTR) output to the FIFO length calculating section 246. The first comparator 254 is coupled to the SUM output and compares that output to the value two hundred fifty-six. The second comparator 256 is coupled to the NPTR output and compares that output to the value 4096. The outputs of the comparators are coupled to the OR gate 258 and the output of the OR gate is coupled to divide by 2 inputs of the respective counters 250, 252. The sense of the output of divider 266 is that larger values of the output result in shorter times between pointer bit leak enables from pointer bit leak enable section 248.

The overall operation of the pointer leak mechanism is improved by employing a correction term which modifies the pointer leak spacing time based on the FIFO length. In particular, the preferred length of the first section FIFO is five hundred twelve bits, and its center point is two hundred fifty-six bits. In the absence of pointer movements, the loop will operate such that the number of bits in the FIFO is approximately two hundred fifty-six. In typical operation, incoming pointer movements will be either mostly positive, or mostly negative. For positive justifications, the number of bits contained in the first stage FIFO will normally trend lower (i.e., below two hundred fifty-six bits), and for negative justifications, the number will normally trend higher. The desired operation of the loop is such that for continuous positive justifications, the FIFO will average approximately one hundred twenty-eight bits "fill" (i.e., the midpoint between the center point and completely empty), and for continuous negative justifications, the FIFO will average three hundred eight-four bits "fill" (i.e., the midpoint between the center point and completely full).

The FIFO length deviation from these midpoints ("128" and "384") is used as follows to determine the correction term which modifies the pointer leak spacing time. First, the value of the FIFO is determined by subtracting IC from WC in summer 259. Then, the absolute value of the difference between the output of summer 259 and the FIFO centerpoint value ("256") is taken by absolute value offset summer 260. The output of summer 260 is a value between zero and two hundred fifty-five. If the FIFO fill is "128" or "384", the value from summer 260 is one hundred twenty-eight (1.0000000). The value from summer 260 is scaled as a fixed point binary number from 0.0000001 to 1.1111111. The output of summer 260 is subtracted at +2 summer 262 from the binary value 10.00000 (2.0 decimal) to produce a term which is unity when the FIFO fill is "128" or "384", greater than unity if the FIFO is "short" (i.e., fewer then "384" or more than "128" bits), and less than unity when the FIFO is "long" (i.e., more than "384" or fewer than "128" bits). This output from summer 262, which can be considered a length adjustment term, is therefore a fractional value between approximately 0.01 and 2 and is used as a control variable (correction term) by multiplier 264 to adjust the SUM value. The adjusted value SUM is used as the divisor at 266; i.e., the control variable which divides the value of NPTR. Thus, given some value of NPTR, if the FIFO fill is relatively "long", the value of the correction term at the summer 262 will be relatively small and will cause the product at 264 to be relatively smaller. As a result, when NPTR is divided by the product of multiplier 264, a relatively large value will result which represents a large deviation of the FIFO from the preferred midpoint resulting in a relatively shorter pointer bit leak time to compensate for the "long" FIFO length. Likewise, if the FIFO fill is relatively "short", the value of the correction term generated by the summer 262 will be greater than unity. As a result, the product of the SUM and the value of the summer 262 will be relatively larger, and when NPTR is divided by the product, a smaller value will result which represents a small deviation of the FIFO from the preferred center point, resulting in a relatively longer pointer bit leak time to compensate for the "short" FIFO length. It will likewise be appreciated that a large pointer movement accumulation represented by numerator NPTR will also cause the resulting value generated by divider 266 to increase.

The value generated by the divider 266 is provided to the pointer bit leak enabling section 248 which includes a summer 268, an eighteen-bit latch 270, and a comparator 272. The summer 268 receives the input from the divider 266 and from the sigma output of the latch 270. The output of the summer 268 is an input to the latch 270 which also receives a clock input from the SONET row clock. The latch 270 provides an output which is compared by the comparator 272 to a preset system gain constant (111110101101010000). Whenever the output of the latch exceeds the preset, the comparator 272 generates a pointer leak enable signal for the IC and clears the latch. If the value of the output of WC-IC summer 259 is greater than two hundred fifty-six, a negative pointer bit leak is commanded so as to increase the value of the count IC (e.g., at 82 or 90 of FIG. 6 or 112, 120 or 128 of FIG. 7). If the value of the output of WC-IC summer 259 is less than two hundred fifty-six, a positive pointer bit leak is commanded to reduce the value of the count IC (e.g., at 78 or 86 of FIG. 6, or 108, 116, or 124 of FIG. 7).

From the foregoing, those skilled in the art will appreciate that the function of the pointer leak control and spacing function 24 (FIG. 5) is to accept demapped data with large gaps arising from SONET/SDH overhead bytes and SONET/SDH pointer movements as well as bit-level gaps from DS-3 or E3 to SONET/SDH stuffing events, and then to pass that data to the second section 14 (FIG. 5) in such a way that the effect of the overhead byte gapping is greatly attenuated, and the effect of pointer movements is expressed as single-bit events, spaced nearly evenly in time. In other words, the pointer leak control and spacing function has two effects. It attenuates the phase wander (phase variations at a frequency under 10 Hz) resulting from received pointer movements, to meet network specifications. It also significantly attenuates the jitter resulting from SONET/SDH overhead bytes, thus reducing the work of the second stage 14, the DCO-based filter.

Returning to FIG. 5, and as previously mentioned, the components of the second stage of the desynchronizer include the read counter 28, the read count length measurement circuit 30, summer 32, averaging means 34, summer 36, DCO 38, and that portion of the dual port RAM 18 having addresses greater than the read count (RC) measurement and less than IC modulo 768. Bits are transferred from the first stage to the second stage by incrementing the IC. Bits are transferred from the second stage to the third stage by the DCO clock 38; i.e., one bit is transferred each pulse of the DCO clock 38. The values of IC and RC are measured synchronously with the received SONET/SDH row, effectively removing the structural jitter. Every row time, summer 32 provides an eight-bit count indicative of the length of the second stage FIFO (IC-RC modulo 768). Eight consecutive values are added and scaled by averager 34 to provide a ten bit count. The second stage FIFO maximum length is defined as 256 bits. It is desired to operate the loop such that the second stage FIFO is half full. Summer 336 adds a value (offset) corresponding to half of the DCO center frequency minus the averager 34 output range to provide a loop control term which is presented to DCO 38 to control its frequency.

The DCO 38 consists of a 23-bit adder 40, a 23-bit latch 42, and a pulse deletion circuit 44. The pulse deletion circuit 44 receives the 51.84 MHz clock which was derived from the received SONET/SDH signal and produces a pattern of pulses. It produces ten or eleven pulses per sixteen cycles of 51.84 MHz for an E3 signal, or thirteen or fourteen pulses per sixteen cycles of the 0 51.84 MHz clock for a DS-3 signal. Selection of ten or eleven for E3 or thirteen or fourteen for DS-3 is made once per sixteen cycles of the 51.84 MHz clock based on the "carry" out of adder 40. Every sixteen cycles of the 51.84 MHz clock, the value of adder 40 is added to the loop control term from summer 36, and the value from adder 40 is stored in latch 42. The ten/eleven or thirteen/fourteen count selection to the pulse deletion controller is made by the "carry" out of adder 40.

The ratio of the number of ten pulses to eleven pulses (or thirteen pulses to fourteen pulses) is controlled by the loop control term, which is determined by the length of the second-stage FIFO; forming a simple first-order control loop. This loop has a narrow bandwidth and produces the desired attenuation effect on SONET/SDH systematic jitter.

The second stage signal output has a residual high-frequency jitter, owing to the mechanism of deletion of a number of pulses from sixteen counts of a 51.84 MHz clock. This high frequency jitter (of 3.42 MHz) is removed by the third stage of the desynchronizer.

The third stage 16 of the desynchronizer 10 includes a FIFO implemented by a sixty-four-bit dual-port RAM 48, a read counter 50, a write counter 52, and an analog section. The analog section includes phase-frequency detector 54, a low pass filter (external capacitor) 56, and an analog voltage controlled oscillator (VCO) 58. According to the presently preferred embodiment, the phasefrequency detector (PFD) 54 is of conventional design.

The input to the third stage (16 in FIG. 5) is the DS-3/E3 data clocked on the DCO gapped signal. This data is written, on this clock, into the sixty-four-bit FIFO (48 in FIG. 5). The FIFO 48 is read out of by the output of the voltage-controlled oscillator 58 at the DS-3/E3 frequency. Both the write and read clocks also drive counters 50, 52. A system phase error term is derived by observing the most-significant-bits (MSBs) of the write and read counters 50, 52. The error term is produced by entering the two MSBs as the two inputs to a standard phase-frequency detector (PFD) 54. The PFD 54 produces two outputs "up" and "down", each of a time-width dependent on the phase-frequency error. An analog filter 56 produces a control voltage which is directly proportional to the integral of the "up" pulse widths minus the "down" pulse widths. This control voltage, appropriately scaled, is used to control the VCO frequency. The loop acts to control the VCO frequency so as to match the recovered DS-3 or E3 frequency.

While this analog loop (third stage) input has a residual jitter at 3.42 MHz, the loop is of sufficiently narrow closed-loop bandwidth (approximately 10 kHz) as to significantly reduce the amplitude of jitter at this frequency on the output. Jitter at the input to the third stage is roughly 1 UI (of the DS~ or E3 frequency), and is less than 0.01 Ul at the output of the third stage.

From the foregoing, those skilled in the art will appreciate that the pointer leak section of the desynchronizer acts in a manner similar to other desynchronizers in that it stores the received pointers and leaks them out at a slower, controlled rate. In the desynchronizer of the invention, however, this function is combined with a data spacing function that is, effectively, a pre-filter. The spacing function removes the SONET/SDH systemic jitter arising from the presence of the four columns of overhead bytes, and replaces it with a higher frequency, more regular gapping pattern. With the SONET/SDH gapping, thirty-two bits of gap occur (twenty-four for the TOH and eight for the POH) at a rate of 72 kHz, the row rate. With the spacing function, gaps apparently occur, but the closed loop portion of the desynchronizer never sees these because of the synchronous manner of their generation, together with the way that the FIFO length is measured.

It will also be appreciated that the inclusion of the length of the pointer length measurement into the pointer leak spacing calculation improves performance by eliminating the "flat spot" due to SONET pointer movement patterns. The "flat spot" of no received pointer movements for three out of ninety calculated pointer movement times (the 87/3 pattern) may result in a system wander specification violation. However, by suitably increasing the pointer bit spacing times as the FIFO shortens (or nears its center point), this effect is eliminated, since the excess of deficit of bits never goes to zero.

It should also be recognized that the apparatus described above should include means (not shown) for testing for illegal relative values of the read counter (RC), write counter (WC), and intermediate counter (IC). If desired, the apparatus described above may include means for disabling the pointer bit leak enable when WC-IC equals the offset value.

It will be appreciated that an STS-3 signal will have a payload of three DS-3 or E3 signals and that it is advantageous to provide a demapper, desynchronizer like the aforementioned L3M™ device which will demap and desynchronize three DS-3 or E3 signals from a single STS-3 signal. Accordingly, the preferred embodiment of the present invention provides on a single chip three desynchronizers of the type described above with reference to FIG. 5. It will be appreciated that a single 51.84 MHz clock will be sufficient for all three desynchronizers.

There have been described and illustrated herein methods and apparatus for desynchronizing a DS-3 or E3 signal from the data portion of a SONET/SDH signal. While particular embodiments of the invention have been described, it is not intended that the invention be limited thereto, as it is intended that the invention be as broad in scope as the art will allow and that the specification be read likewise.Thus, while the invention was described with reference to desynchronizing a DS-3 or E3 signal from an STS-1 signal, it will be appreciated that the invention applies to the desynchronizing of any first framed signal a second framed signal which is gapped due to overhead having been removed from the second framed signal. In addition, while the preferred embodiment of the invention has been described as being implemented with RAM memory, counters, registers, latches, and logic elements, it will be appreciated that different hardware and/or software could be utilized to implement the stated functions. Thus, the invention can be implemented entirely in hardware components (discrete or integrated), or alternatively implemented in software. Also, while the invention was described in two embodiments as using different particular time periods (e.g., T80 or SONET/SDH row time) for updating the intermediate count, it will be appreciated that other time periods could be utilized. Likewise, while the invention was described as being carried out in three stages, it will be appreciated that additional stages can be utilized, or that (although not preferred) two stages could be utilized. Further, while the invention was described as utilizing certain offset values, certain gain constants, certain control values, and certain size counters and RAMS, etc., it will be appreciated that other values, constants and implementations could be utilized. It will therefore be appreciated by those skilled in the art that yet other modifications could be made to the provided invention without deviating from its spirit and scope as so claimed.

What is claimed is:

1. An apparatus for desynchronizing a DS-3/E3 signal from the demapped data portion of a SONET/SDH signal which includes pointer justifications and bit stuffs, said apparatus comprising:
    a) a first FIFO having an input and an output, said input receiving the de-mapped data portion of a SONET/SDH signal;
    b) a write address counter associated with said first FIFO and incremented by said data bits only of said data portion of said SONET/SDH signal, said write address counter indicating a writing location in said FIFO;
    c) a read address counter associated with said first FIFO, said read address counter indicating a reading location in said FIFO;
    d) an intermediate address count register which indicates an intermediate location in said FIFO between said reading and writing locations, said intermediate address count register being incremented in part as a function of said pointer justifications and said stuff bits; and
    e) a first clock for reading data out of said FIFO and for incrementing said read address counter, said first clock having a rate substantially equal to said DS-3/E3 signal, and said first clock derived in part from a difference between a count of said read address counter and a count of said intermediate address count register.

2. An apparatus according to claim 1, further comprising: means associated with said FIFO for writing said data bits into said FIFO according to a gapped clock having a frequency of 51.84 MHz±20 ppm.

3. An apparatus according to claim 2, further comprising:
    a spacing filter for generating said first clock at a frequency of nominally 44.736 MHz±20 ppm or nominally 34.368 MHz±20 ppm from a second clock having a frequency of nominally 51.84 MHz.

4. An apparatus according to claim 3, further comprising:
    an accumulator coupled to a latch and having a carry output, said carry output coupled to and controlling said spacing filter,
    averaging means for receiving said difference between said count of said read address counter and said count of said intermediate address count register and for generating an average of every n differences,
    summing means coupled to said averaging means for adding each average of every n differences to an offset number to create a control number, said summing means coupled to said accumulator, whereby
        each control number is added to each previous control number to generate a carry at a spacing frequency for controlling said spacing filter.

5. An apparatus according to claim 4, wherein:
    said spacing frequency is 10 or 11 pulses for every 16 pulses of the first clock signal.

6. An apparatus according to claim 4, wherein:
    said spacing frequency is 13 or 14 pulses for every 16 pulses of said second clock signal.

7. An apparatus according to claim 1, further comprising:

means for incrementing said intermediate address count register in part as a function of said pointer justifications and said stuff bits.

8. An apparatus according to claim 7, wherein:

said means for incrementing said intermediate address count register includes means for generating a row clock, each cycle of which corresponds to 720 bits of said SONET/SDH signal and for indexing said intermediate counter by an amount selected from the group consisting of 620, 621, 622, and 623 or from the group consisting of group consisting of 475, 476, 477, 478, and 479 during each cycle of said partial row clock.

9. An apparatus according to claim 7, wherein:

said means for incrementing said intermediate address count register includes means for generating a partial row clock, each cycle of which corresponds to eighty bits of said SONET/SDH signal and for indexing said intermediate counter by an amount selected from the group consisting of 68, 69, 70, and 71 or from the group consisting of group consisting of 52, 53, 54, 55, and 56 during each cycle of said partial row clock.

10. An apparatus according to claim 7, wherein:

said means for incrementing includes means for generating a control variable which is a function of a time count (SUM) and a net pointer justification value (NPTR).

11. An apparatus according to claim 10, wherein:

said means for generating a control variable includes means for taking a ratio of said net pointer justification value and a function of said time count.

12. An apparatus according to claim 11, wherein:

said function of said time count is a multiplier of said time count, said multiplier being a function of a difference of a count of said write address counter (WC) and a count of said intermediate address count register (IC).

13. An apparatus according to claim 12, wherein:

said function of a difference comprises a constant minus a fractional binary representation of an absolute value of said difference minus an offset value.

14. An apparatus according to claim 13, wherein:

said means for incrementing further comprises means for generating a pointer leak enable utilizing said control variable, wherein a sign of said pointer leak is determined by the sign of said difference minus said offset value.

15. An apparatus according to claim 14, wherein:

said means for incrementing said intermediate address count register includes means for generating a partial row clock, each cycle of which corresponds to eighty bits of said SONET/SDH signal and for indexing said intermediate counter by an amount selected from the group consisting of 68, 69, 70, and 71 during each cycle of said partial row clock, said means for indexing indexes said intermediate counter by 69 for eight out of nine partial row clock cycles, and for one out of nine partial row clock cycles, said means for indexing indexes said intermediate counter by
68 if a stuff and a positive pointer leak are indicated,
69 if a stuff and no pointer leak are indicated,
70 if a stuff and a negative pointer leak are indicated,
69 if no stuff and a positive pointer leak are indicated,
70 if no stuff and no pointer leak are indicated,
71 if no stuff and a negative pointer leak are indicated.

16. An apparatus according to claim 14, wherein:

said means for incrementing said intermediate address count register includes means for generating a partial row clock, each cycle of which corresponds to eighty bits of said SONET/SDH signal and for indexing said intermediate counter by an amount selected from the group consisting of group consisting of 52, 53, 54, 55, and 56 during each cycle of said partial row clock, said means for indexing indexes said intermediate counter by 53 for twenty-six out of twenty-seven partial row clock cycles, and for one out of twenty-seven partial row clock cycles, said means for indexing indexes said intermediate counter by
52 if two stuffs and a positive pointer leak are indicated,
53 if two stuffs and no pointer leak are indicated,
54 if two stuffs and a negative pointer leak are indicated,
54 if no stuffs and a positive pointer leak are indicated,
55 if no stuffs and no pointer leak are indicated,
56 if no stuffs and a negative pointer leak are indicated,
53 if one stuff and a positive pointer leak are indicated,
54 if one stuff and no pointer leak are indicated,
55 if one stuff and a negative pointer leak are indicated.

17. An apparatus according to claim 14, wherein:

said means for incrementing said intermediate address count register includes means for generating a row clock, each cycle of which corresponds to 720 bits of said SONET/SDH signal and for indexing said intermediate counter by an amount selected from the group consisting of 620, 621, 622, and 623 during each cycle of said row clock, and for one out of nine row clock cycles, said means for indexing indexes said intermediate counter by
620 if a stuff and a positive pointer leak are indicated,
621 if a stuff and no pointer leak are indicated,
662 if a stuff and a negative pointer leak are indicated,
621 if no stuff and a positive pointer leak are indicated,
622 if no stuff and a no positive pointer leak are indicated,
623 if no stuff and a negative pointer leak are indicated.

18. An apparatus according to claim 14, wherein:

said means for incrementing said intermediate address count register includes means for generating a row clock, each cycle of which corresponds to 720 bits of said SONET/SDH signal and for indexing said intermediate counter by an amount selected from the group consisting of group consisting of 475, 476, 477, 478, and 479 during each cycle of said row clock, and for one out of three row clock cycles means for indexing indexes said intermediate counter by
475 if two stuffs and a positive pointer leak are indicated,
476 if two stuffs and no pointer leak are indicated,
477 if two stuffs and a negative pointer leak are indicated,
477 if no stuffs and a positive pointer leak are indicated,
478 if no stuffs and no pointer leak are indicated,
479 if no stuffs and a negative pointer leak are indicated,
476 if one stuff and a positive pointer leak are indicated,
477 if one stuff and no pointer leak are indicated,
478 if one stuff and a negative pointer leak are indicated.

19. An apparatus according to claim 1, further comprising:

a second FIFO having an input coupled to said output of said first FIFO, and a smoothing filter means coupled to said second FIFO for clocking data out of said second FIFO.

20. An apparatus according to claim 19, wherein:

said smoothing filter includes a second write counter and a second read counter both coupled to said second FIFO, and a phase-frequency detector for filtering said first clock signal.

21. An apparatus according to claim 20, wherein:

said smoothing filter further comprises a low pass filter coupled to said phase-frequency detector, and a voltage-controlled oscillator coupled to said low pass filter and to said second FIFO, said voltage-controlled oscillator clocking data out of said second FIFO.

22. An apparatus for desynchronizing a first telecommunications signal from the de-mapped data portion of a second higher speed telecommunications signal which includes at least one of pointer justifications and bit stuffs, said apparatus comprising:

a) a first FIFO having an input and an output, said input receiving the de-mapped data portion of said second higher speed signal;

b) a write address counter associated with said first FIFO and incremented by said data bits only of said data portion of said second higher speed signal, said write address counter indicating a writing location in said FIFO;

c) a read address counter associated with said first FIFO, said read address counter indicating a reading location in said FIFO;

d) an intermediate address count register which indicates an intermediate location in said FIFO between said reading and writing locations, said intermediate address count register being incremented in part as a function of said pointer justifications and said stuff bits; and e) a first clock for reading data out of said FIFO and for incrementing said read address counter, said first clock having a rate substantially equal to said first telecommunications signal, and said first clock derived in part from a difference between a count of said read address counter and a count of said intermediate address count register.

23. An apparatus according to claim 22, further comprising:

said means for incrementing said intermediate address count register in part as a function of said pointer justifications and said stuff bits.

24. An apparatus according to claim 23, wherein:

said means for incrementing said intermediate address count register includes means for indexing said intermediate counter by an amount selected from a first group of values.

25. An apparatus according to claim 24, wherein:

said means for indexing includes means for generating a control variable which is a function of a time count (SUM) and a net pointer justification value (NPTR).

26. An apparatus according to claim 25, wherein:

said means for generating a control variable includes means for taking a ratio of said net pointer justification value and a function of said time count.

27. An apparatus according to claim 26, wherein:

said function of said time count is a multiplier of said time count, said multiplier being a function of a difference of a count of said write address counter (WC) and a count of said intermediate address count register (IC).

28. An apparatus according to claim 27, wherein:

said function of a difference comprises a constant minus a fractional binary representation of an absolute value of said difference minus an offset value.

29. An apparatus according to claim 28, wherein:

said means for indexing further comprises means for generating a pointer leak enable utilizing said control variable, wherein a sign of said pointer leak is determined by the sign of said difference minus said offset value.

30. An apparatus according to claim 22, further comprising:

a second FIFO having an input coupled to said output of said first FIFO, and a smoothing filter means coupled to said second FIFO for clocking data out of said second FIFO.

31. An apparatus according to claim 30, wherein:

said smoothing filter includes a second write counter and a second read counter both coupled to said second FIFO, and a phase-frequency detector for filtering said first clock signal.

32. An apparatus according to claim 31, wherein:

said smoothing filter further comprises a low pass filter coupled to said phase-frequency detector, and a voltage-controlled oscillator coupled to said low pass filter and to said second FIFO, said voltage-controlled oscillator clocking data out of said second FIFO.

* * * * *

UNITED STATES PATENT AND TRADEMARK OFFICE
CERTIFICATE OF CORRECTION

PATENT NO.     : 6,463,111 B1
DATED          : October 8, 2002
INVENTOR(S)    : Daniel C. Upp Page 1 of 1

It is certified that error appears in the above-identified patent and that said Letters Patent is hereby corrected as shown below:

<u>Title page, Item [54] and Column 1, lines 1-4,</u>
Should read -- METHOD AND APPARATUS FOR DESYNCHRONIZING A DS-3 SIGNAL AND/OR AN E3 SIGNAL FROM THE DATA PORTION OF AN STS/STM PAYLOAD --

Signed and Sealed this

Seventh Day of January, 2003

JAMES E. ROGAN
*Director of the United States Patent and Trademark Office*